United States Patent
Hao et al.

(10) Patent No.: US 10,101,396 B2
(45) Date of Patent: Oct. 16, 2018

(54) DETECTION OF CURRENT SENSOR MALFUNCTION

(71) Applicant: GM Global Technology Operations LLC, Detroit, MI (US)

(72) Inventors: Lei Hao, Troy, MI (US); Chandra S. Namuduri, Troy, MI (US); Suresh Gopalakrishnan, Troy, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 0 days.

(21) Appl. No.: 15/433,038

(22) Filed: Feb. 15, 2017

(65) Prior Publication Data

US 2018/0231611 A1    Aug. 16, 2018

(51) Int. Cl.
| | |
|---|---|
| H02P 6/12 | (2006.01) |
| H02H 9/02 | (2006.01) |
| G01R 31/34 | (2006.01) |
| H02P 27/06 | (2006.01) |

(52) U.S. Cl.
CPC ............ *G01R 31/343* (2013.01); *H02P 27/06* (2013.01)

(58) Field of Classification Search
USPC .................. 318/400.37, 400.38, 400.39, 490
See application file for complete search history.

(56) References Cited

U.S. PATENT DOCUMENTS

| | | | |
|---|---|---|---|
| 4,085,355 A * | 4/1978 | Fradella | ................. H02P 23/06 318/703 |
| 9,041,392 B2 * | 5/2015 | Kotera | ............... G01R 19/0092 324/244 |

* cited by examiner

*Primary Examiner* — Bentsu Ro
(74) *Attorney, Agent, or Firm* — Cantor Colburn LLP

(57) ABSTRACT

A machine control system and a method of detecting a current sensor malfunction include obtaining a first current signal from a first current sensor corresponding with a first phase of a multi-phase machine, obtaining a second current signal from a second current sensor corresponding with a second phase of the multi-phase machine, and obtaining a position signal indicating an angular position of a rotor of the multi-phase machine corresponding with values of the first current signal and the second current signal. A determination is made of whether the current sensor malfunction occurred in the first current sensor or the second current sensor based only on the values of the first current signal and the second current signal at four of the angular positions of the rotor.

17 Claims, 5 Drawing Sheets

DETECTION OF CURRENT SENSOR MALFUNCTION

The subject disclosure relates to the detection of current sensor malfunction.

Electromagnetic systems use a stationary stator and a moving component, the rotor, to produce torque. Multiple sets of windings in the stator are used to generate multiple phases of current. Generally, in a multi-phase balance system, current sensors are used to measure one or more of the phase currents. The current values provide a feedback in order to control the machine. For example, electric or hybrid automobiles include an interior permanent magnet machine, which has a rotor embedded with permanent magnets. The control of the machine requires a determination of the current signals from two or the three phases. Accordingly, it is desirable to provide detection of current sensor malfunction using only two current sensors.

SUMMARY

In one exemplary embodiment, a method of detecting a current sensor malfunction includes obtaining a first current signal from a first current sensor corresponding with a first phase of a multi-phase machine and obtaining a current signal from a second current sensor corresponding with a second phase of the multi-phase machine. A position signal is obtained and indicates an angular position of a rotor of the multi-phase machine corresponding with values of the first current signal and the second current signal. A determination is made of whether the current sensor malfunction occurred in the first current sensor or the second current sensor based only on the values of the first current signal and the second current signal at four of the angular positions of the rotor.

In addition to one or more of the features described herein, the method includes obtaining a sum signal as a sum of the values of the first current signal and the second current signal and a difference signal as a difference of the values of the first current signal and the second current signal.

In addition to one or more of the features described herein, the method includes determining an index value from values of the sum signal and the different signal at the four of the angular positions of the rotor indicated by the position signal.

In addition to one or more of the features described herein, determining the index value includes using the values of the sum signal at two of the four of the angular positions of the rotor and the values of the difference signal at another two of the four of the angular positions of the rotor.

In addition to one or more of the features described herein, determining the index value includes determining two of the angular positions of the rotor at which the values of the sum signal are zero and another two of the angular positions of the rotor at which the values of the difference signal are zero.

In addition to one or more of the features described herein, determining whether the current sensor malfunction occurred includes comparing the index value with a predefined threshold.

In another exemplary embodiment, a machine control system includes a first current sensor to output a first current signal corresponding with a first phase of a multi-phase machine, a second current sensor to output a second current signal corresponding with a second phase of the multi-phase machine, and a position sensor to output a position signal indicating an angular position of a rotor of the multi-phase machine corresponding with values of the first current signal and the second current signal. A controller determines whether a malfunction occurred in the first current sensor or the second current sensor based only on the values of the first current signal and the second current signal at four of the angular positions of the rotor.

In addition to one or more of the features described herein, the controller obtains a sum signal as a sum of the values of the first current signal and the second current signal and a difference signal as a difference of the values of the first current signal and the second current signal.

In addition to one or more of the features described herein, the controller determines an index value from values of the sum signal and the different signal at the four of the angular positions of the rotor indicated by the position signal.

In addition to one or more of the features described herein, the controller determines the index value using the values of the sum signal at two of the four of the angular positions of the rotor and the values of the difference signal at another two of the four of the angular positions of the rotor.

In addition to one or more of the features described herein, the controller determines the index value based on determining two of the angular positions of the rotor at which the values of the sum signal are zero and another two of the angular positions of the rotor at which the values of the difference signal are zero.

In addition to one or more of the features described herein, the controller determines whether the malfunction occurred by comparing the index value with a predefined threshold.

In addition to one or more of the features described herein, the machine control system is housed in a hybrid or electric automobile.

In yet another exemplary embodiment, an automobile includes a three-phase machine, and a machine control system. The machine control system includes a first current sensor to output a first current signal corresponding with a first phase of a multi-phase machine, a second current sensor to output a second current signal corresponding with a second phase of the multi-phase machine, and a position sensor to output a position signal indicating an angular position of a rotor of the multi-phase machine corresponding with values of the first current signal and the second current signal. A controller determines whether a malfunction occurred in the first current sensor or the second current sensor based only on the values of the first current signal and the second current signal at four of the angular positions of the rotor.

In addition to one or more of the features described herein, the controller obtains a sum signal as a sum of the values of the first current signal and the second current signal and a difference signal as a difference of the values of the first current signal and the second current signal.

In addition to one or more of the features described herein, the controller determines an index value from values of the sum signal and the different signal at the four of the angular positions of the rotor indicated by the position signal.

In addition to one or more of the features described herein, the controller determines the index value using the values of the sum signal at two of the four of the angular positions of the rotor and the values of the difference signal at another two of the four of the angular positions of the rotor.

In addition to one or more of the features described herein, the controller determines the index value based on determining two of the angular positions of the rotor at which the values of the sum signal are zero and another two of the angular positions of the rotor at which the values of the difference signal are zero.

In addition to one or more of the features described herein, the controller determines whether the malfunction occurred by comparing the index value with a predefined threshold.

In addition to one or more of the features described herein, the automobile is an electric or hybrid automobile.

The above features and advantages, and other features and advantages of the disclosure are readily apparent from the following detailed description when taken in connection with the accompanying drawings.

BRIEF DESCRIPTION OF THE DRAWINGS

Other features, advantages and details appear, by way of example only, in the following detailed description, the detailed description referring to the drawings in which.

DETAILED DESCRIPTION

Figure 1:
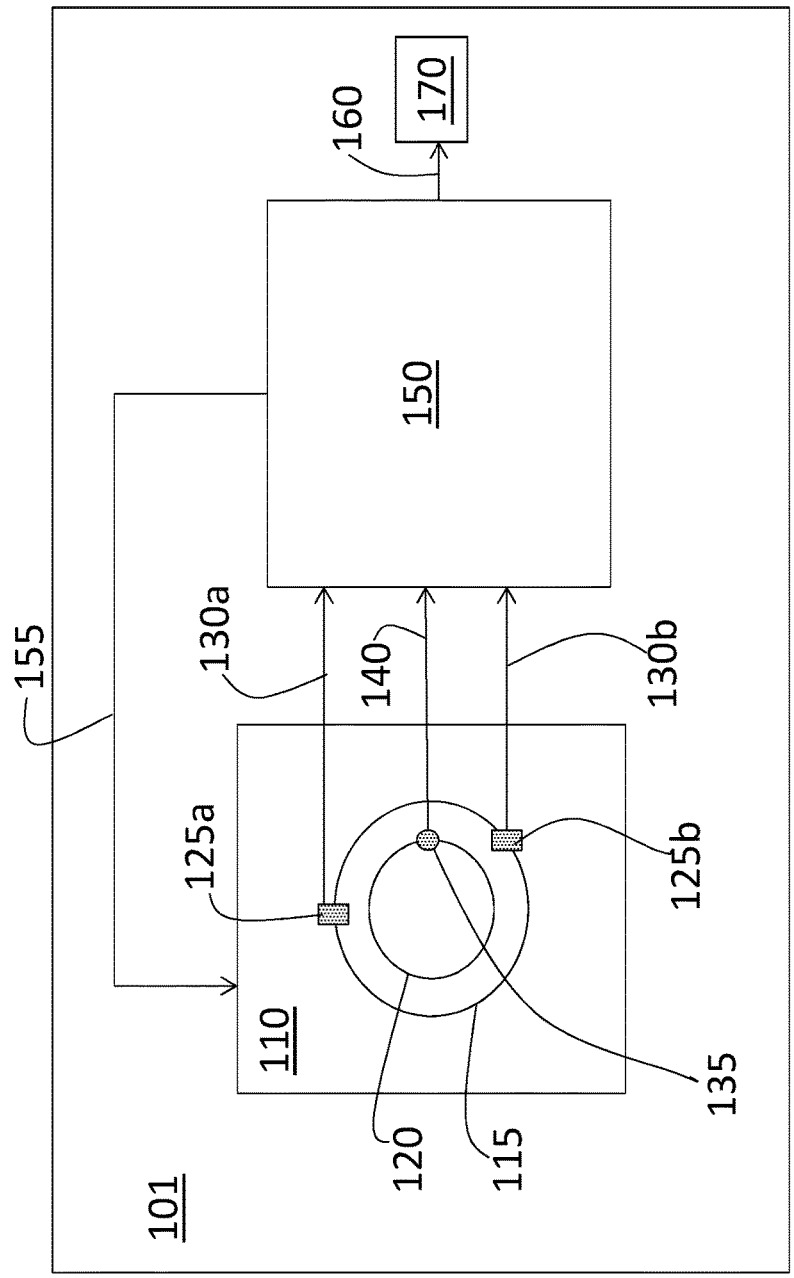
FIG. 1 is a block diagram of a machine control system according to one or more embodiments.

The following description is merely exemplary in nature and is not intended to limit the present disclosure, its application or uses. It should be understood that throughout the drawings, corresponding reference numerals indicate like or corresponding parts and features.

As previously noted, a typical way to control a three-phase machine requires using two current sensors to measure the current generated at two of the phases for feedback. To ensure correct control based on the measured current signals, a way to detect malfunctions in the current sensors is also required. Prior methods of detecting malfunctions in current sensors have required three current signals from all three phases and, thus, three current sensors. The addition of a current sensor to the system for the purpose of detecting malfunctions in the current sensors has a corresponding cost. Embodiments of the systems and methods described herein relate to using only the two current sensors that are required for the feedback control to also detect any malfunctions in those current sensors.

In accordance with an exemplary embodiment, FIG. 1 is a block diagram of a machine control system. The machine 110 may be an internal permanent magnet machine in a hybrid or electric automobile 101, for example. The machine 110 can also be another type of three-phase electromagnetic system that includes a stator 115 and rotor 120. Two current sensors 125a, 125b are used to obtain two current signals 130a, 130b, respectively, corresponding with two phases of the current generated by the movement of the rotor 120. In a three-phase machine with phases A, B, and C, for example, the two current signals 130a, 130b may correspond with phases A and B, B and C, or A and C. A position sensor 135 provides a position signal 140 that indicates the position of the rotor 120. The position sensor 135 may be any known position sensor such as a rotary position sensor or another absolute position sensor such as a resolver.

A controller 150 receives the two current signals 130a, 130b and the position signal 140. The position signal 140 indicates the angular position of the rotor 120. The current signals 130a, 130b indicate current values of two phases of the machine 110. The current sensors 125a, 125b and the position sensor 135 are sampled such that the current values are indicated by the current signals 130a, 130b for the same times that the positions of the rotor 120 are indicated by the position signal 140.

The controller 150 includes processing circuitry that may include an application specific integrated circuit (ASIC), an electronic circuit, a processor (shared, dedicated, or group) and memory that executes one or more software or firmware programs, a combinational logic circuit, and/or other suitable components that provide the described functionality. The controller 150 provides a control signal 155 to control the machine 110 based on the two received current signals 130a, 130b. The control of the machine 110 based on the current signals 130a, 130b is known and is not the focus of the one or more embodiments detailed herein. The use of the two, and only two, current signals 130a, 130b that relate to only two of the phases of a multi-phase machine 110 to detect a malfunction in one or both of the current sensors 125a, 125b is further detailed with reference to FIGS. 2-5. In this regard, the controller 150 outputs an indication 160 when a malfunction is detected in a current sensor 125a, 125b. The indication 160 may be provided to another controller 170 of the hybrid or electric automobile 101, for example.

Figure 2:
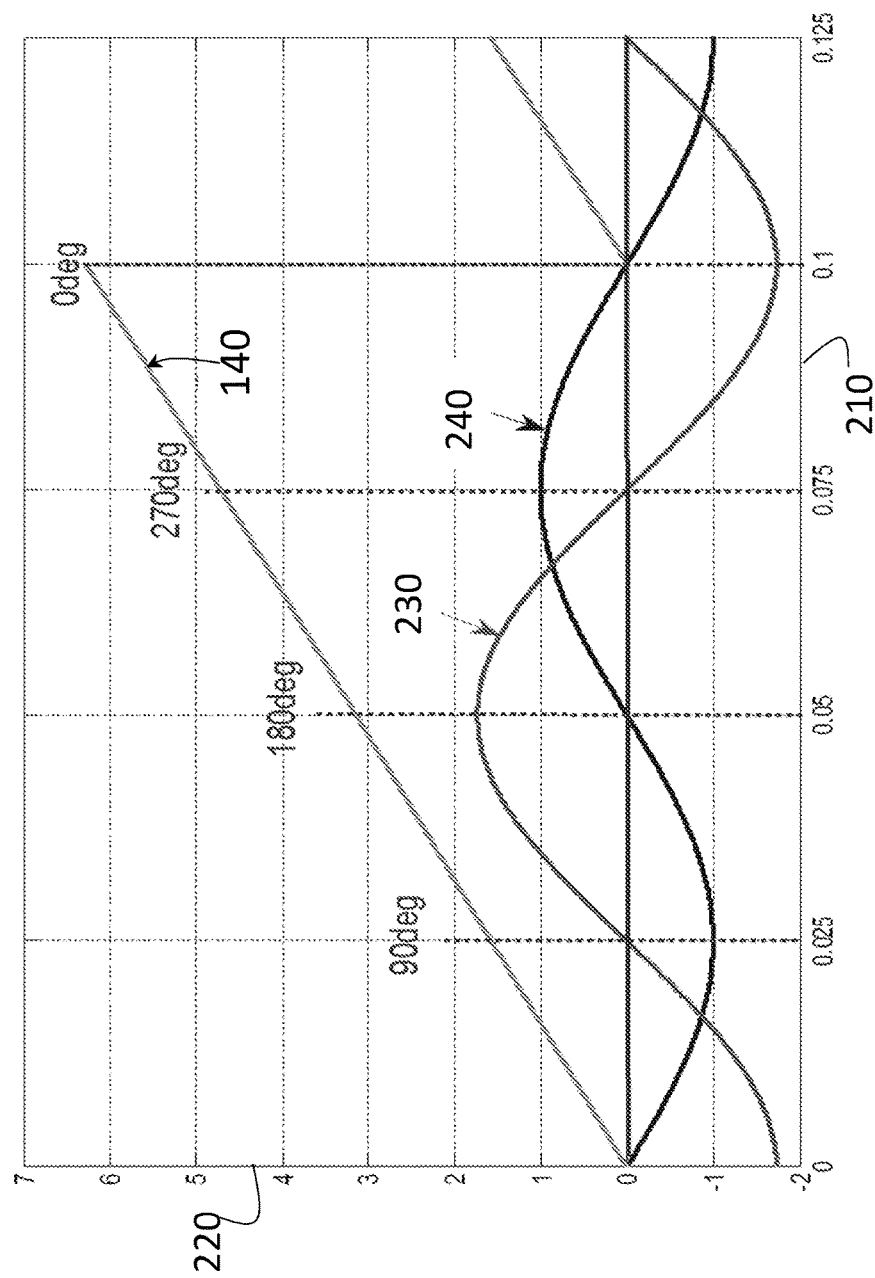
FIG. 2 shows the signals used to determine whether one of two current sensors has a malfunction according to one or more embodiments.

FIG. 2 shows the signals used to determine whether one of two current sensors 125a, 125b has a malfunction according to one or more embodiments. In FIG. 2, time, in seconds, is shown on axis 210, and current amplitude per unit (normalized current), is shown on axis 220. The position signal 140 indicates the times at which the rotor 120 reaches 90 degrees (deg), 180 deg, 270 deg, and 0 deg, all in electrical degrees. These four positions of the rotor 120 are of interest. Although FIG. 2 indicates these four positions of the rotor 120 as occurring at equal time intervals, the positions can be reached at non-uniform durations of time. The sum of the current signals 130a, 130b is indicated as sum signal 230, and the difference of the current signals 130a, 130b (e.g., signal 130a–signal 130b, signal 130b–signal 130a) is indicated as difference signal 240. When there is no malfunction in the current sensors 125a, 125b, either the sum signal 230 or the difference signal 240 should be zero at each of the positions of interest of the rotor 120 (i.e., at 90 deg, 180 deg, 270 deg, 0 deg (or 360 deg)). As FIG. 2 indicates, the difference signal 240 is zero at 90 deg and 270 deg, and the sum signal 230 is zero at 180 deg and 360/0 deg, thereby indicating no malfunction in the current sensors 125a, 125b.

Figure 3:
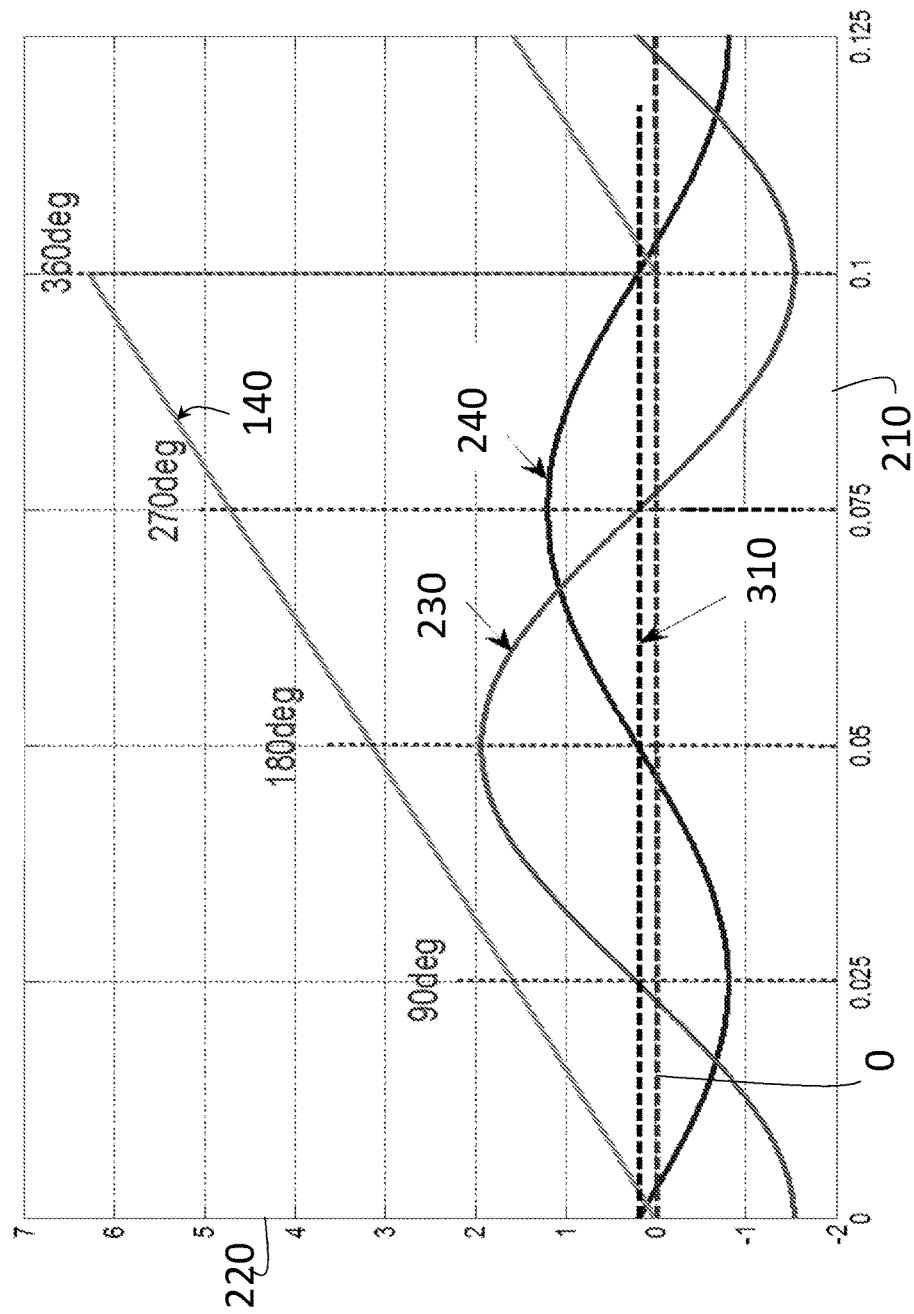
FIG. 3 shows an exemplary malfunction indicated by the signals from the current sensors according to one or more embodiments.

FIG. 3 shows an exemplary malfunction indicated by the signals from the current sensors 125a, 125b according to one or more embodiments. The malfunction indicated by FIG. 3 is referred to as offset current. The offset line 310 is indicated in FIG. 3 above the zero (0) line. When the rotor 120 is at 90 deg and 270 deg, the difference signal 240 is at the offset value indicated by the offset line 310 rather than at zero, indicated by the zero (0) line. When the rotor 120 is at 180 deg and 360/0 deg, the sum signal 230 is at the offset value indicated by the offset line 310 rather than at zero, indicated by the zero (0) line.

Figure 4:
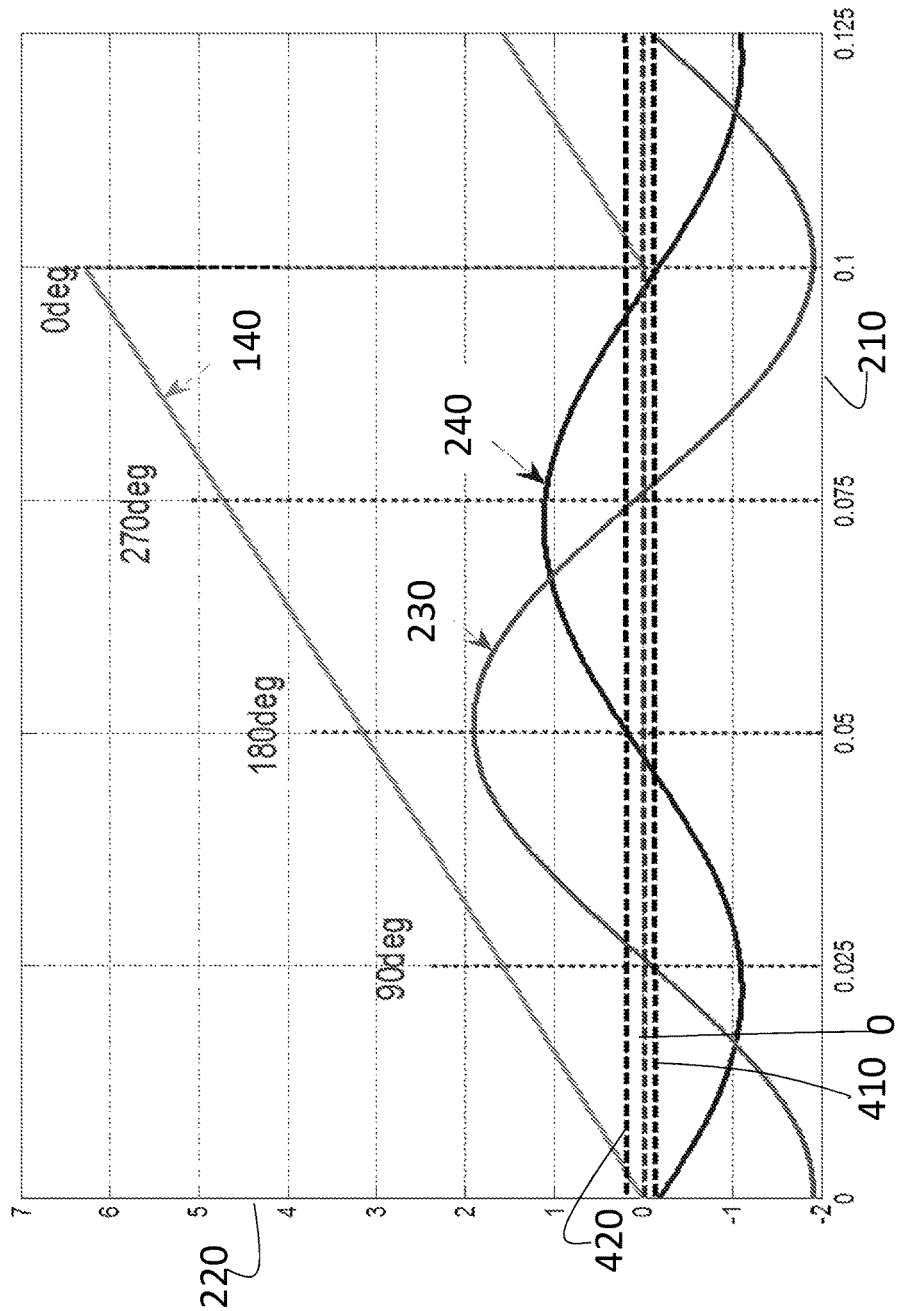
FIG. 4 shows another exemplary malfunction indicated by the signals from the current sensors according to one or more embodiments.

FIG. 4 shows another exemplary malfunction indicated by the signals from the current sensors 125a, 125b according to one or more embodiments. The malfunction indicated by FIG. 4 is referred to as sensitivity error. As discussed with reference to FIG. 3, the offset error is consistent for both the sum signal 230 and the difference signal 240 (i.e., each of the signals is greater than zero at the positions of interest for the rotor 120). The sensitivity error, on the other hand, does not result in the same shift from the zero line for the sum signal 230 and difference signal 240. Accordingly, two offset lines 410, 420 are shown along with the zero (0) line in FIG. 4.

FIGS. 3 and 4 illustrate two sets of sum signals 230 and difference signals 240 associated with different malfunctions of the current sensors 125a, 125b. The controller 150 may obtain an index value to make the determination of whether a current sensor 125a, 125b is malfunctioning. That is, in order to account for manufacturing tolerances of the current sensors 125a, 125b, the index value may be determined from the sum signal 230 and the difference signal 240 and compared with a threshold. The threshold can be set and adjusted based on pulse-width modulation noise level and allowance for errors based on tolerances listed by a manufacturer of the current sensors 125a, 125b.

One exemplary index may indicate the maximum offset from zero for the sum signal 230 and difference signal 240 at each of the four positions of interest. For example, the index can be the maximum among the offset from 0 of the sum signal 230 values at positions 180 deg and 360/0 deg, and the offset from 0 of the difference signal 240 values at positions 90 deg and 270 deg.

According to anther embodiment, the position difference from 90 deg, 180 deg, 270 deg, and 360/0 deg at the zero points of the sum signal 230 and difference signal 240 may be used to obtain the index rather than the value difference from 0 at those positions of interest for the rotor 120. Thus, a maximum among the angle differences between the rotor 120 positions at which the sum signal 230 is zero and the positions 180 deg and 360/0 deg and the angle differences between the rotor 120 positions at which the difference signal 240 is zero and the positions 90 deg and 270 deg can be used to find the index.

Figure 5:
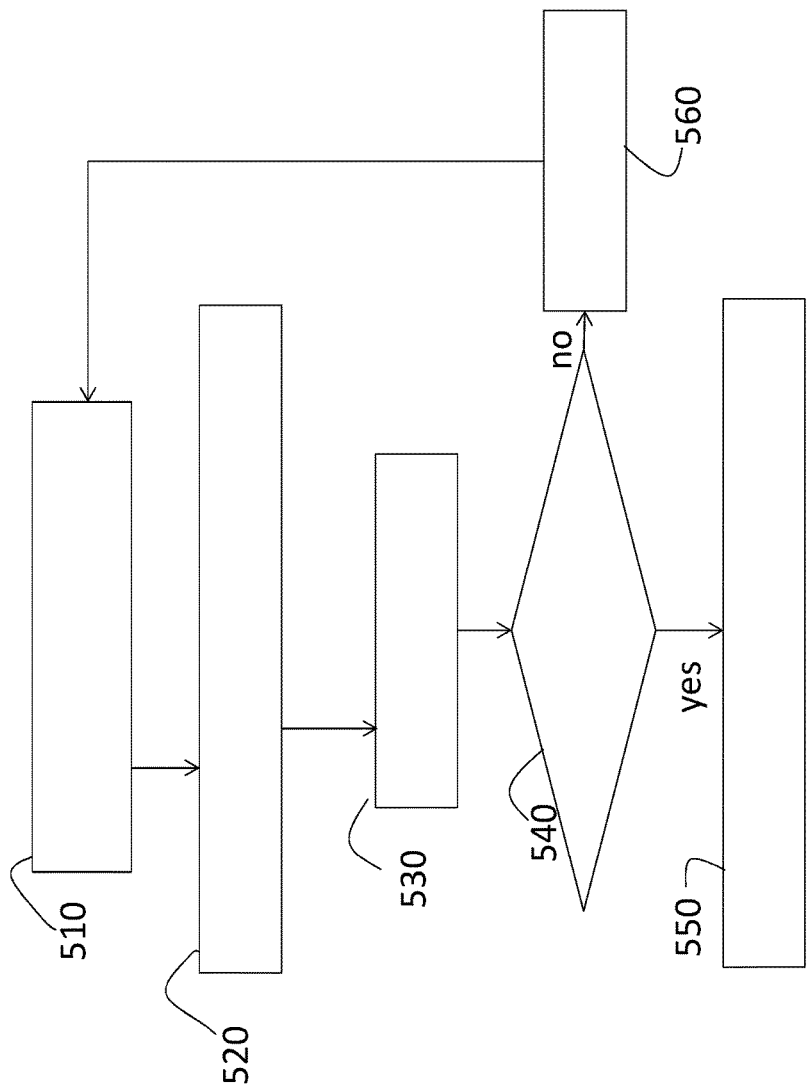
FIG. 5 is a process flow of a method of detecting a malfunction in one or both current sensors using only two current sensors for a multi-phase machine according to one or more embodiments.

FIG. 5 is a process flow of a method of detecting a malfunction in one or both current sensors 125a, 125b using only two current sensors for a multi-phase machine according to one or more embodiments. The processes are performed by the controller 150. At block 510, obtaining the two current signals 130a, 130b and the position signal 140 is from the two current sensors 125a, 125b and the position sensor 135. Obtaining the sum signal 230 and difference signal 240, at block 520, includes respectively adding the values of the two current signals 130a, 130b and subtracting the values of one of the two current signals 130a, 130b from the other. At block 530, obtaining an index value from the sum signal 230 and the difference signal 240 includes using one of the processes described previously, for example.

At block 540, the index is checked against predefined threshold values. When the index exceeds the threshold, a malfunction in a current sensor 125a, 125b is indicated by the controller 150 at block 550. The indication 160 can be visual, audible, or a combination of types, for example. When the index does not exceed the threshold, a determination of no malfunction is made at block 560, and the processes at blocks 510 through 540 are repeated, as indicated. The processes shown in FIG. 5 may be continually performed while the machine 110 is operated.

While the above disclosure has been described with reference to exemplary embodiments, it will be understood by those skilled in the art that various changes may be made and equivalents may be substituted for elements thereof without departing from its scope. In addition, many modifications may be made to adapt a particular situation or material to the teachings of the disclosure without departing from the essential scope thereof. Therefore, it is intended that the present disclosure not be limited to the particular embodiments disclosed, but will include all embodiments falling within the scope thereof.

What is claimed is:

1. A method of detecting a current sensor malfunction, the method comprising:
   obtaining a first current signal from a first current sensor corresponding with a first phase of a multi-phase machine;
   obtaining a second current signal from a second current sensor corresponding with a second phase of the multi-phase machine;
   obtaining a position signal indicating an angular position of a rotor of the multi-phase machine corresponding with values of the first current signal and the second current signal; and
   determining whether the current sensor malfunction occurred in the first current sensor or the second current sensor based only on the values of the first current signal and the second current signal at four of the angular positions of the rotor by obtaining an index value using the first current signal and the second current signal at the four of the angular positions of the rotor indicated by the position signal, and comparing the index value with a predefined threshold.

2. The method according to claim 1, further comprising obtaining a sum signal as a sum of the values of the first current signal and the second current signal and a difference signal as a difference of the values of the first current signal and the second current signal.

3. The method according to claim 2, further comprising determining the index value from values of the sum signal and the difference signal at the four of the angular positions of the rotor indicated by the position signal.

4. The method according to claim 3, wherein the determining the index value includes using the values of the sum signal at two of the four of the angular positions of the rotor and the values of the difference signal at another two of the four of the angular positions of the rotor.

5. The method according to claim 3, wherein the determining the index value includes determining two of the angular positions of the rotor at which the values of the sum signal are zero and another two of the angular positions of the rotor at which the values of the difference signal are zero.

6. A machine control system, comprising:
   a first current sensor configured to output a first current signal corresponding with a first phase of a multi-phase machine;
   a second current sensor configured to output a second current signal corresponding with a second phase of the multi-phase machine;
   a position sensor configured to output a position signal indicating an angular position of a rotor of the multi-phase machine corresponding with values of the first current signal and the second current signal; and
   a controller configured to determine whether a malfunction occurred in the first current sensor or the second current sensor based only on the values of the first current signal and the second current signal at four of the angular positions of the rotor by obtaining an index value using the first current signal and the second current signal at the four of the angular positions of the rotor indicated by the position signal, and comparing the index value with a predefined threshold.

7. The system according to claim 6, wherein the controller is further configured to obtain a sum signal as a sum of the values of the first current signal and the second current signal and a difference signal as a difference of the values of the first current signal and the second current signal.

8. The system according to claim 7, wherein the controller is further configured to determine the index value from values of the sum signal and the difference signal at the four of the angular positions of the rotor indicated by the position signal.

9. The system according to claim 8, wherein the controller is further configured to determine the index value using the values of the sum signal at two of the four of the angular positions of the rotor and the values of the difference signal at another two of the four of the angular positions of the rotor.

10. The system according to claim 8, wherein the controller is further configured to determine the index value based on determining two of the angular positions of the rotor at which the values of the sum signal are zero and another two of the angular positions of the rotor at which the values of the difference signal are zero.

11. The system according to claim 6, wherein the machine control system is housed in a hybrid or electric automobile.

12. An automobile, comprising:
a three-phase machine; and
a machine control system, comprising:
    a first current sensor configured to output a first current signal corresponding with a first phase of a multi-phase machine;
    a second current sensor configured to output a second current signal corresponding with a second phase of the multi-phase machine;
    a position sensor configured to output a position signal indicating an angular position of a rotor of the multi-phase machine corresponding with values of the first current signal and the second current signal; and
    a controller configured to determine whether a malfunction occurred in the first current sensor or the second current sensor based only on the values of the first current signal and the second current signal at four of the angular positions of the rotor by obtaining an index value using the first current signal and the second current signal at the four of the angular positions of the rotor indicated by the position signal, and comparing the index value with a predefined threshold.

13. The automobile according to claim 12, wherein the controller is further configured to obtain a sum signal as a sum of the values of the first current signal and the second current signal and a difference signal as a difference of the values of the first current signal and the second current signal.

14. The automobile according to claim 13, wherein the controller is further configured to determine the index value from values of the sum signal and the difference signal at the four of the angular positions of the rotor indicated by the position signal.

15. The automobile according to claim 14, wherein the controller is further configured to determine the index value using the values of the sum signal at two of the four of the angular positions of the rotor and the values of the difference signal at another two of the four of the angular positions of the rotor.

16. The automobile according to claim 14, wherein the controller is further configured to determine the index value based on determining two of the angular positions of the rotor at which the values of the sum signal are zero and another two of the angular positions of the rotor at which the values of the difference signal are zero.

17. The automobile according to claim 12, wherein the automobile is an electric or hybrid automobile.

* * * * *